(12) United States Patent
Liu

(10) Patent No.: US 6,664,502 B1
(45) Date of Patent: Dec. 16, 2003

(54) WORKPIECE HOLDER WITH MULTIPLE RECESSES TO FURTHER SUPPORT WORKPIECE IN PARALLEL LASER DRILLING

(75) Inventor: Xinbing Liu, Acton, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/266,993

(22) Filed: Oct. 8, 2002

Related U.S. Application Data
(60) Provisional application No. 60/398,412, filed on Jul. 25, 2002.

(51) Int. Cl.[7] ............................................. B23K 26/00
(52) U.S. Cl. ........................ 219/121.7; 219/121.68; 219/121.67
(58) Field of Search .................... 219/121.7, 121.68, 219/121.67, 121.6

(56) References Cited

U.S. PATENT DOCUMENTS 5,350,479 A * 9/1994 Collins et al. ............... 156/345
6,365,869 B1 * 4/2002 Swain et al. ............. 219/121.6

* cited by examiner

Primary Examiner—M. Alexandra Elve
(74) Attorney, Agent, or Firm—Harness, Dickey & Pierce, PLC

(57) ABSTRACT

An improved workpiece holder is provided for use in a laser drilling system. The workpiece holder includes: a body having at least one planar support surface adapted to support a workpiece; a plurality of recesses formed in the planar support surface; at least one groove formed in the planar support surface; and a vacuum passage extending through the body of the holder. In addition, the plurality of recesses may be configured to align with the drilling pattern of the laser drilling system.

16 Claims, 6 Drawing Sheets

Top view of a workpiece holder with a plurality of recesses

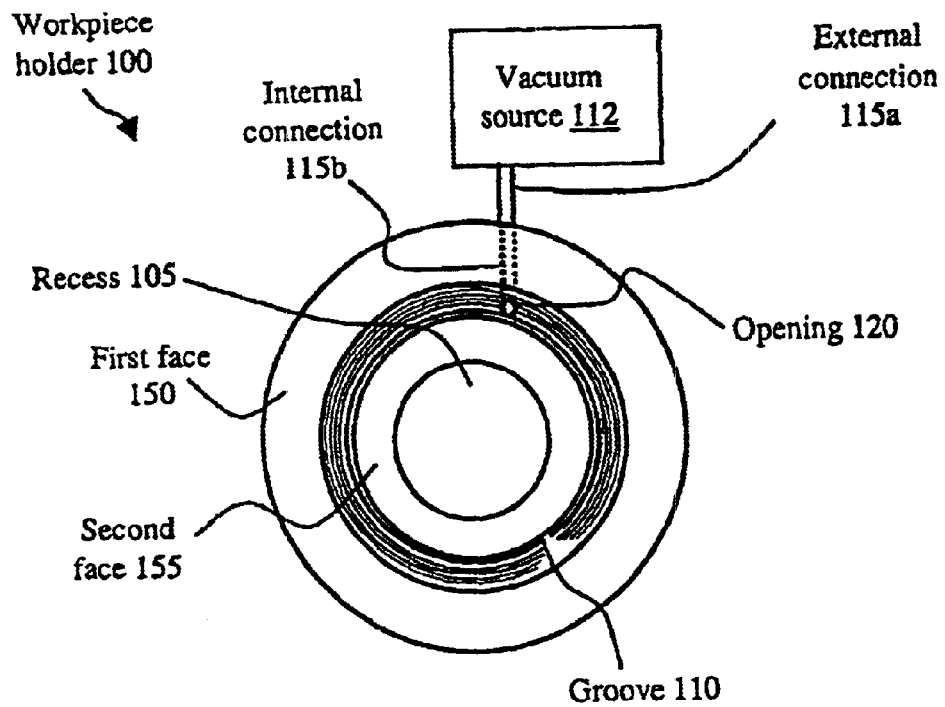
Figure.1A Top view of prior art workpiece holder
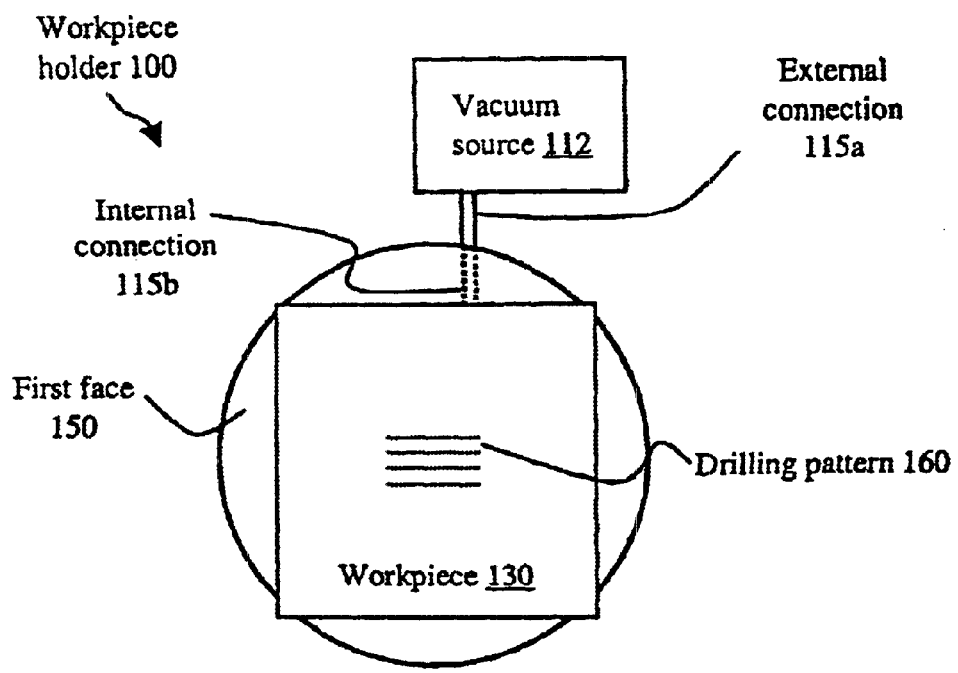
Figure 1B Top view of prior art workpiece holder with workpiece

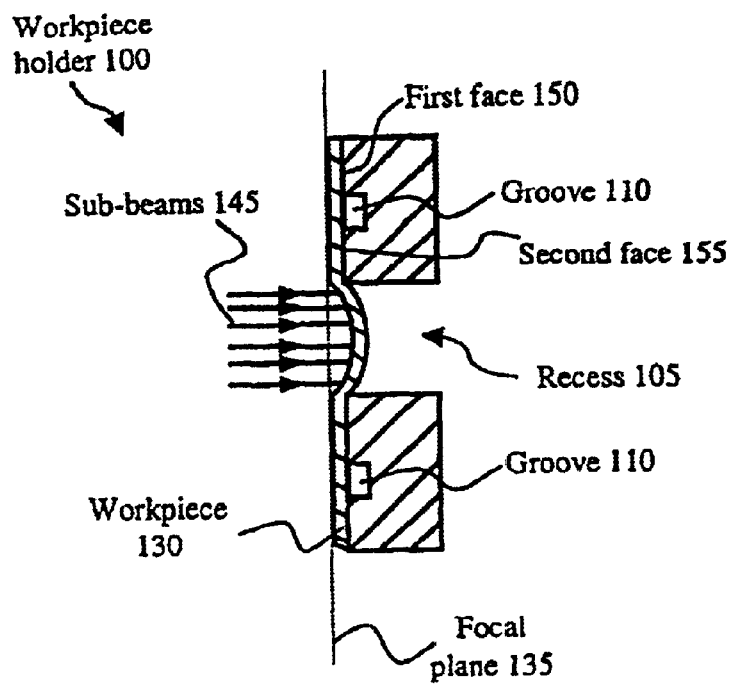
Figure 1C Side view of prior art workpiece holder showing incident sub-beams
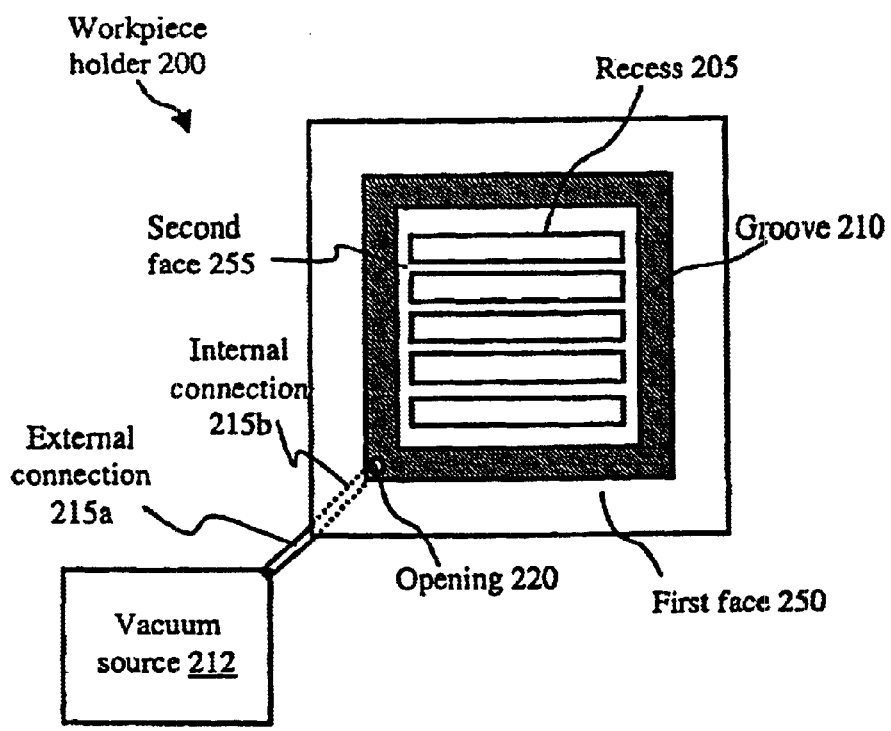
Figure 2A Top view of a workpiece holder with a plurality of recesses

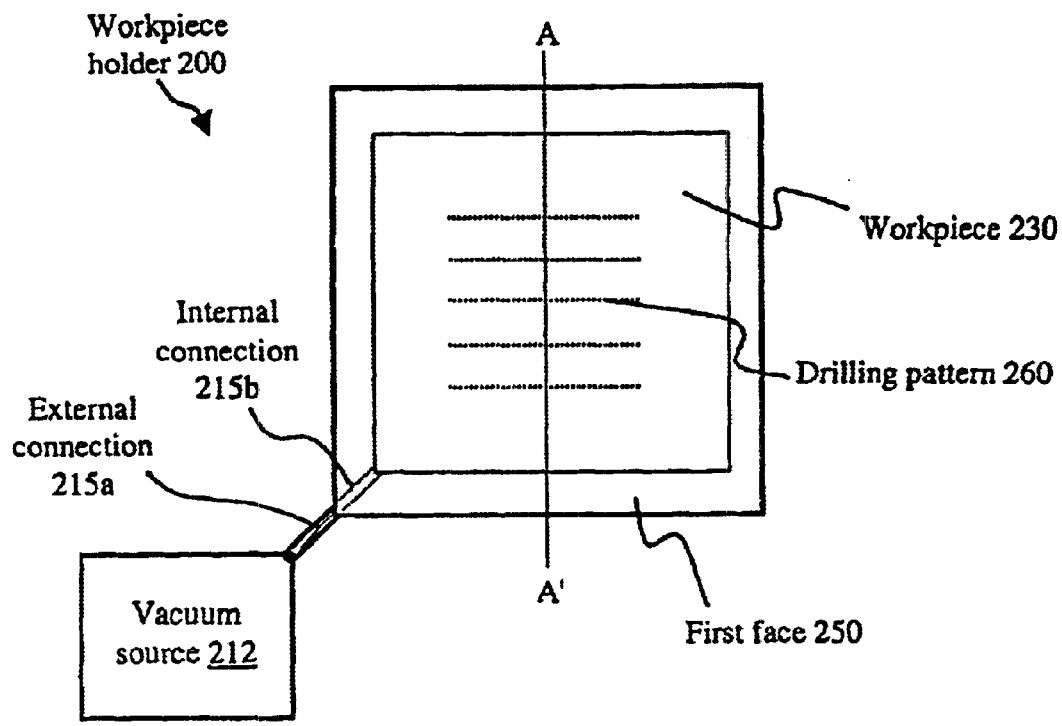
Figure 2B Top view of a workpiece holder with workpiece in place
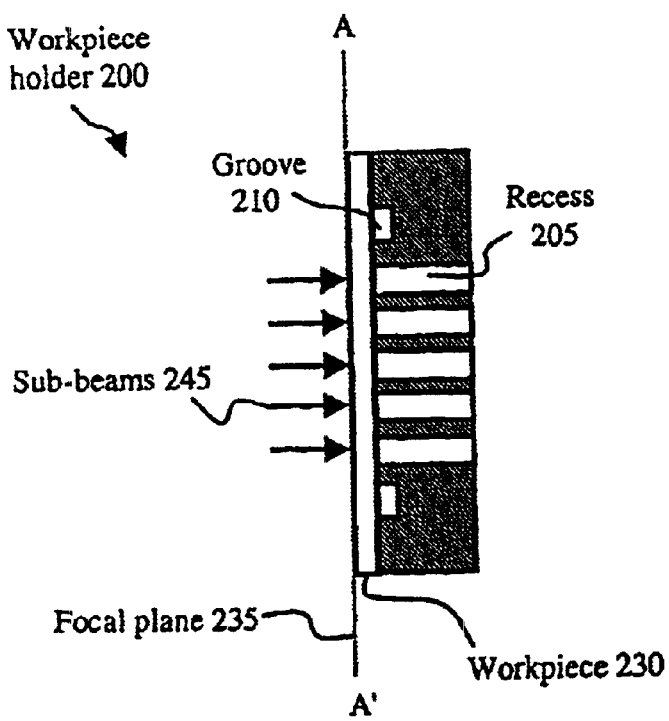
Figure 2C Cross-sectional view of a workpiece holder with a plurality of recesses

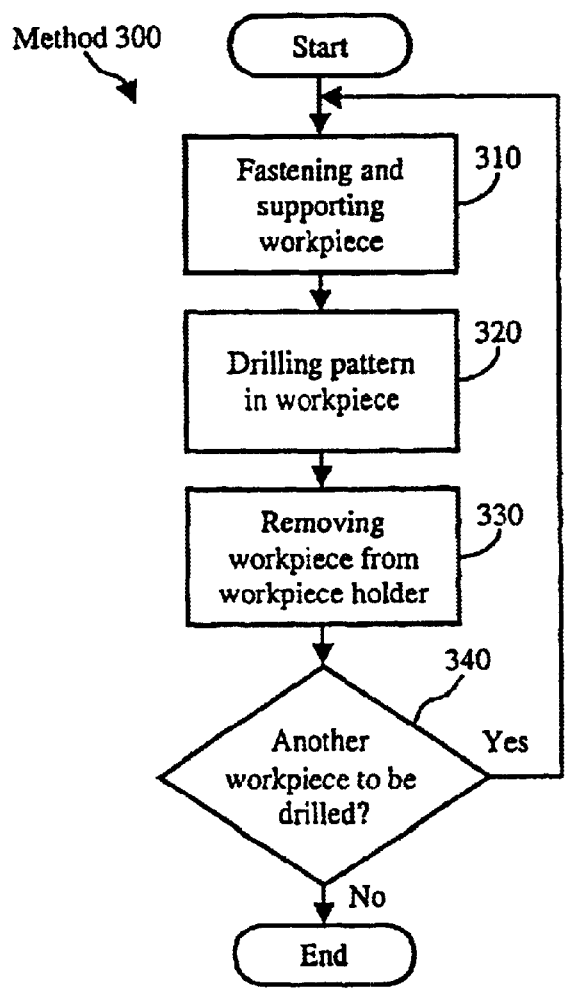
Figure 3 Method of using workpiece holder with multiple recesses in parallel laser drilling

WORKPIECE HOLDER WITH MULTIPLE RECESSES TO FURTHER SUPPORT WORKPIECE IN PARALLEL LASER DRILLING

CROSS-REFERENCE TO RELATED APPLICATIONS

This application claims the benefit of U.S. Provisional Application Serial No. 60/398,412 which was filed on Jul. 25, 2002 and is incorporated by reference herein.

FIELD OF THE INVENTION

The present invention relates generally to laser drilling, and more particularly, to a workpiece holder having multiple recesses to better support a flimsy workpiece during a laser drilling operation.

BACKGROUND OF THE INVENTION

Material ablation by pulsed light sources has been studied since the invention of the laser. Reports in 1982 of polymers having been etched by ultraviolet (UV) excimer laser radiation stimulated widespread investigations of the process for micromachining. Since then, scientific and industrial research in this field has proliferated—mostly spurred by the remarkably small features that can be drilled, milled, and replicated through the use of lasers.

Ultrafast lasers generate intense laser pulses with durations from roughly $10^{-11}$ seconds (10 picoseconds) to $10^{-14}$ seconds (10 femtoseconds). Short pulse lasers generate intense laser pulses with durations from roughly $10^{-10}$ seconds (100 picoseconds) to $10^{-11}$ seconds (10 picoseconds). A wide variety of potential applications for ultrafast and short pulse lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in various applications, such as cooling channels in turbine blades, nozzles in ink-jet printers, or holes in printed circuit boards.

Optical parallel processing of laser-milled holes is key to increasing the throughput and profitability of laser micromachining. Beamsplitting devices such as diffractive optical elements are currently used in laser micromachining to divide a single beam into multiple beams to allow for parallel processing of the workpiece (i.e., the material to be drilled).

In order to perform precision laser drilling in a parallel process system, the workpiece surface must remain in the focal plane of the laser drilling system (the plane in which the laser beams are focused) throughout the laser drilling process to enable the beams to drill workpiece geometries meeting precise specifications. However, the use of thin, flimsy workpieces (workpieces that bend and move outside the focal plane of the drilling laser beam when the workpiece is impacted with the beam), which are required in applications such as inkjet nozzles, poses a challenge because the workpiece deforms during drilling and moves outside the laser system's focal plane. This results in poor quality laser-drilled holes and an inability to meet required product specifications. What is needed is a way to improve the support of a flimsy workpiece in a parallel laser drilling system.

SUMMARY OF THE INVENTION

In accordance with the present invention, an improved workpiece holder is provided for use in a laser drilling system. The workpiece holder includes: a body having at least one planar support surface adapted to support a workpiece; a plurality of recesses formed in the planar support surface; at least one groove formed in the planar support surface; and a vacuum passage extending through the body of the holder. In one embodiment, the plurality of recesses are configured to align with the drilling pattern of the laser drilling system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

FIG. 1A is a top view of a conventional workpiece holder;

FIG. 1B is a top view of the conventional workpiece holder supporting a workpiece thereon;

FIG. 1C is a side view of the conventional workpiece holder illustrating the affect of a series of laser sib-beams incident on a surface of the workpiece;

FIG. 2A is a top view of an improved workpiece holder in accordance with the present invention;

FIG. 2B is a top view of the improved workpiece holder of the present invention supporting a workpiece thereon;

FIG. 2C is a side view of the improved workpiece holder of the present invention illustrating the affect of a series of laser sib-beams incident on a surface of the workpiece;

FIG. 3 is a flowchart illustrating a method of using the improved workpiece holder in accordance with the present invention;

DETAILED DESCRIPTION OF THE PREFERRED EMBODIMENTS

Figure 4:
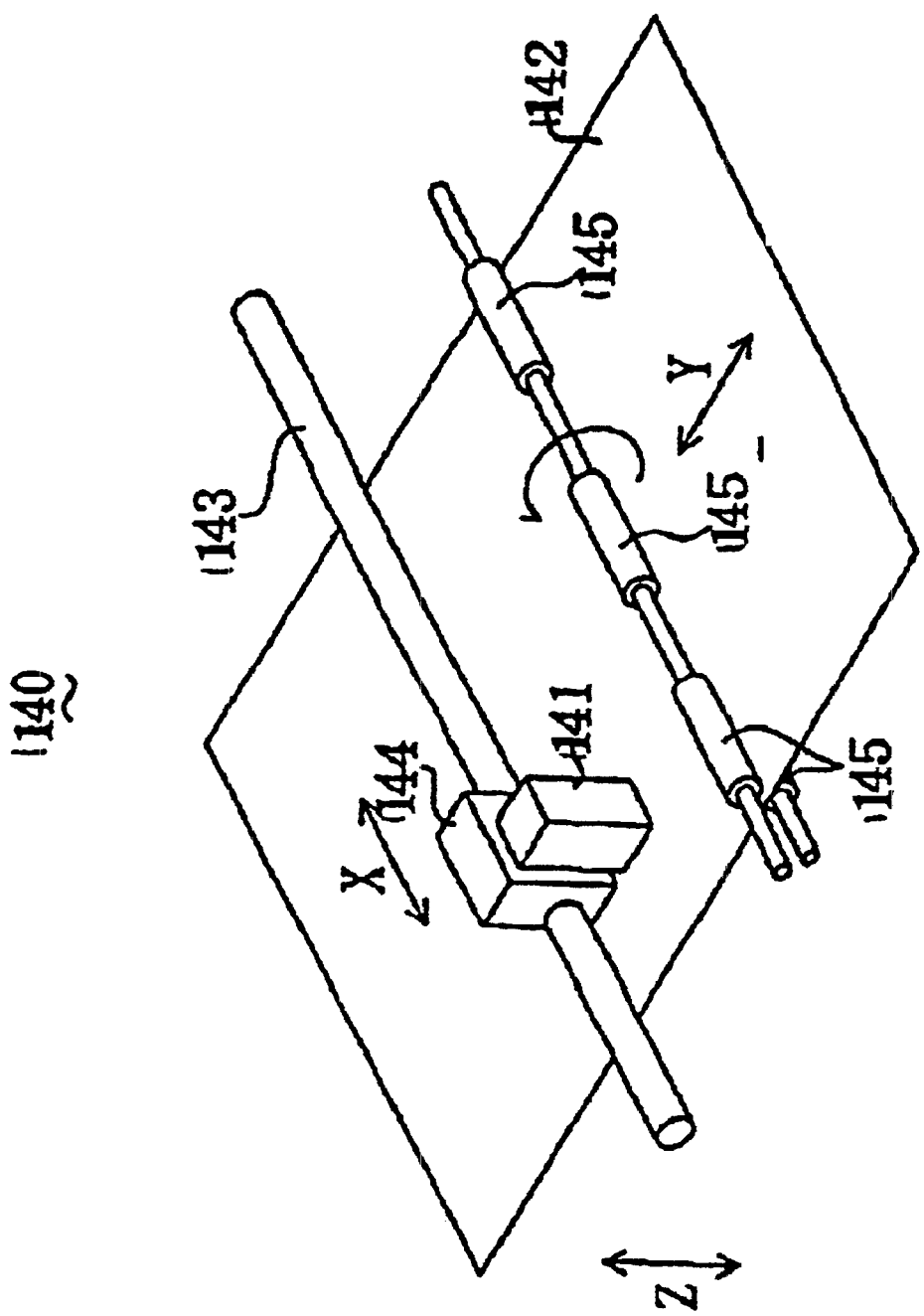
FIG. 4 is a perspective view illustrating the primary components of an ink-jet printer.

FIG. 1A shows a top view of a conventional workpiece holder 100. The workpiece holder 100 includes a recess 105, a groove 110, a vacuum source 112, an external connection 115a, an internal connection 115b, an opening 120, a first face 150, and a second face 155. The first face 150 is the planar surface defined between the recess 105 and the groove 110; whereas the second face 155 is the planar surface defined between the groove and the outer periphery of the workpiece holder 100.

FIG. 1B is a top view of the conventional workpiece holder 100 supporting a workpiece 130 thereon. The workpiece 130 is fastened to workpiece holder 100, such that the workpiece 130 extends across the recess 105 formed in the workpiece holder 100. In a laser drilling system, the workpiece holder 100 is used to support the workpiece 130 during laser drilling. The drilling pattern 160 is the pattern of holes to be drilled by laser drilling system (not shown). An exemplary drilling pattern 160 is illustrated on the exposed surface of the workpiece 130.

The workpiece holder 100 is round, but could be formed in a variety of shapes, including triangular, square, rectangular, pentagon, etc. Workpiece holder 100 is made of a hard, durable, stiff, and heat-resistant material (e.g., steel, aluminum, machinable ceramic, etc.). Workpiece holder 100 may be attached to a fixed or a moveable stage in a laser drilling system using nuts and bolts or other similar attachment means.

Recess 105 is an opening allowing the laser system sub-beams to propagate through workpiece holder 100 without impacting and damaging workpiece holder 100. Thus, the recess 105 is preferably larger than the drilling pattern 160.

Groove 110 is a grooved area around workpiece holder 100. In a preferred embodiment, the groove 110 is rectangular with corners at 90-degree angles; however, groove 110 is not limited to this shape. For instance, the groove 110 may have a circular shape. The groove 110 is dimensioned such that the workpiece 130 covers the recess 105 and the groove 110.

Opening 120 is a hole that provides an opening for vacuum source 112 to put a vacuum in groove 110 under workpiece 130. In the exemplary embodiment, the opening 120 is a round hole; however, opening 120 is not limited to this shape. Opening 120 connects via the internal vacuum passage 115b through the workpiece holder 100 to the external connection 115a, thereby allowing a vacuum source 112 to create a vacuum through opening 120.

Vacuum source 112 may be implemented using a commercially available vacuum source such as those manufactured by Varian and GAST Mfg. Corp. The vacuum source 112 creates a vacuum through opening 120, internal connection 115b, and external connection 115a in groove 110 underneath workpiece 130, thereby effectively securing the workpiece 130 to the workpiece holder 100.

External connection 115a is a connection between vacuum source 112 and workpiece holder 100. In one embodiment, the external connection 115a is a flexible hose connected between the workpiece holder 100 and the vacuum source 112. Internal connection 115b is a continuation of opening 120, providing a hole through workpiece holder 100 where workpiece holder 100 meets with external connection 115a. External connection 115a and internal connection 115b are used to draw a vacuum from groove 110 as described above. Further implementation details for the conventional workpiece holder 100 are disclosed in U.S. Pat. No. 6,365,869 issued on Apr. 2, 2002 which is incorporated herein by reference.

FIG. 1C shows a side view of workpiece holder 100, including recess 105, groove 110, workpiece 130, first face 150, and second face 155. Of particular interest, several sub-beams 145 are shown incident upon the surface of the workpiece 130. The sub-beams may be emitted from a beamsplitter (not shown) and are used to perform parallel process laser drilling of the drilling pattern 160 in the targeted workpiece 130. Sub-beams 145 are focused at a focal plane 135.

However, due to the flimsy nature of the workpiece, the surface of the workpiece 130 is shown not aligned with the focal plane 135 of the laser drilling system. In one exemplary embodiment, the workpiece 130 may be further defined as a stainless steel inkjet nozzle foil. The result of drilling operation deforms the workpiece 130 such that is does not meet product specifications (e.g., hole size, hole shape, taper angle). The deformation of workpiece 130 is the problem solved by the present invention.

In operation, vacuum source 112 is turned on to hold workpiece 130 against workpiece holder 100 by removing air from groove 110, through opening 120, internal connection 115b, and external connection 115a, creating a reduced atmospheric pressure in groove 110 such that the ambient atmospheric pressure fastens workpiece 130 to workpiece holder 100. Sub-beams 145 propagate from a beamsplitter (not shown) in a laser drilling system (not shown), are incident upon workpiece 130, and are maneuvered to drill the desired workpiece geometry in workpiece 130. The recoil pressure caused by debris kickback during ablation by sub-beams 145 causes workpiece 130 to deform and moves the targeted pattern area of workpiece 130 out of focal plane 135.

In accordance with the present invention, an improved workpiece holder 200 is shown in FIGS. 2A–2C. The improved workpiece holder 200 generally includes: a groove 210, a vacuum source 212, an external connection 215a, an internal connection 215b, an opening 220, a first face 250, and a second face 255 as described above. In addition, the improved workpiece holder 200 includes a plurality of recesses 205 that are cut completely through the workpiece holder 200. The recesses 205 are need when one or more through holes are to be formed in the workpiece. In this way, the beams will not impact and thus damage the workpiece holder 200.

FIG. 2B shows a top view of workpiece holder 200 supporting a workpiece 230 thereon. The workpiece 230 is fastened to workpiece holder 200 as shown, and covers other elements of workpiece holder 200. It should be noted that the recesses 205 are designed to align with the drilling pattern 260 as shown in FIG. 2C. It is envisioned that the plurality of recesses may be configured to align with a variety of drilling patterns 260.

Recess 205 is an opening allowing for the laser system's subbeams 245 to propagate through workpiece holder 200 without impacting and damaging workpiece holder 200. Within workpiece holder 200, there is a plurality of recesses 205. The presence of second face 255 (also referred to as intermediate support surfaces) between recesses 205 provides increased support for workpiece 230.

The plurality of recesses 205 with second face 255 further supporting workpiece 230 between recesses 205 ensures that workpiece holder 200 can keep flimsy workpiece 230 in focal plane 235 of a parallel laser drilling system's sub-beams 245. This is the primary improvement of the present invention.

Groove 210 is a grooved area around the workpiece holder and is designed to accommodate the shape of workpiece 230. In alternate embodiments, there may be more than one groove 210 in workpiece holder 200 to provide additional surface area needed for holding workpiece 230 on workpiece holder 200.

Vacuum source 212 is a conventional vacuum pump such as those manufactured by Varian and GAST Mfg. Corp. Vacuum source 212 pulls a vacuum through opening 220 and connection to vacuum source 215, from groove 210, underneath the workpiece, effectively fastening it to workpiece holder 200.

External connection 215a and internal connection 215b are used to allow vacuum source 212 to pull a vacuum from groove 210 as described above. In one example, external connection 215a is a flexible hose connected to workpiece holder 200 and vacuum source 212. Internal connection 215b is a continuation of opening 220, leading to external connection 215a and vacuum source 212.

Opening 220 is a hole that provides an opening for vacuum source 212 to pull a vacuum in groove 210 under workpiece 230 and accommodates the shape of vacuum source 212.

Workpiece 230 is a flimsy workpiece that is the target of a laser drilling system. In one example, workpiece 230 is a stainless steel inkjet nozzle foil. Workpiece 230 is supported by first face 250 outside groove 210, and by second face 255 inside groove 210 and between each recess 205, keeping workpiece 230 in focal plane 235 even when force from sub-beams 245 is exerted upon workpiece 230.

First face 250 and second face 255 are planar surfaces used to support workpiece 230 upon workpiece holder 200. First face 250 and second face 255 are perpendicular to the optical path of sub-beams 245. This positioning of first face 250 and second face 255 is important in order to keep the target area of workpiece 230 within focal plane 235. First face 250 is located around the outside of groove 210, as shown in FIG. 2A. Second face 255 is located inside groove 210 and between the plurality of recesses 205, also shown in FIG. 2A.

Drilling pattern 260 represents a pattern of holes to be drilled by sub-beams 245 of the laser drilling system. Drilling pattern 260 is a representative pattern and the present invention is not limited to work with drilling pattern 260 as shown in FIG. 2A. As shown in FIG. 2B, drilling pattern 260 consists of five rows of holes; however, in other examples drilling pattern 260 consists of eight rows of thirty-eight holes, or ten rows of forty holes.

The present invention does require that each workpiece holder 200 used to support workpiece 230 in a parallel laser drilling system be customized for use with a new drilling pattern 260 to ensure that the plurality of recesses 205 within workpiece holder 200 are arranged to match drilling pattern 260. Recesses 205 must be designed to match drilling pattern 260 in order to prevent workpiece holder 200 from being damaged by the drilling of sub-beams 245, and must be arranged to match drilling pattern 260 in such a way that second face 255 provides support sufficient to keep workpiece 230 in focal plane 235 of sub-beams 245.

Sub-beams 245 are emitted from a beam-splitter (not shown) in a laser drilling system (not shown) to perform parallel drilling upon targeted workpiece 230. Sub-beams 245 are incident upon workpiece 230 and are maneuvered to drill defined holes in workpiece 230. Sub-beams 245 are focused upon the target area of workpiece 230 to enable sub-beams 245 to perform precision drilling of workpiece 230, creating a final product that meets specifications.

In operation, vacuum source 212 is turned on to hold workpiece 230 against workpiece holder 200 by removing air from groove 210, through opening 220 into internal connection 215b and external connection 215a, pulling a vacuum in groove 210 such that the vacuum fastens workpiece 230 to workpiece holder 200. Sub-beams 245 propagate from a beam-splitter (not shown) in a laser drilling system (not shown), are incident upon workpiece 230, and are maneuvered to drill the desired workpiece geometry in workpiece 230. Workpiece 230 is supported by first face 250 and second face 255, and is kept in focal plane 235. When sub-beams 245 have completed "through-hole" drilling of workpiece geometry in workpiece 230, sub-beams 245 pass through workpiece holder 200 without impacting workpiece holder 200.

A significant improvement of workpiece holder 200 over the conventional workpiece holder is the additional support provided to workpiece 230 by the presence of second face 255 surrounding the plurality of customized recesses 205. Recesses 205 enable second face 255 to provide more support to workpiece 230, keeping workpiece 230 in focal plane 235, and therefore allowing the laser drilling system to create workpiece geometry that meets specifications.

FIG. 3 illustrates an exemplary method 300 of using the improved workpiece holder 200 in parallel laser drilling system. In step 310, workpiece 230 is placed on workpiece holder 200 and fastened such that it will not move during laser drilling. Workpiece holder 200 supports workpiece 230 with second face 255 to keep the surface of workpiece 230 in focal plane 235. In one example, workpiece 230 is placed on workpiece holder 200 by a robot arm and fastened to workpiece holder 200 by turning on vacuum source 212 to remove air from groove 210, sealing workpiece 230 against first face 250 and second face 255 of workpiece holder 200. In another example, workpiece 230 is placed upon workpiece holder 200 by a system operator and fastened to workpiece holder 200 with an adhesive.

In step 320, the desired pattern is drilled by maneuvering subbeams 245 upon workpiece 230 according to the pre-defined milling algorithms. Milling (and correction) algorithms are stored in a computer (not shown) and communicated to elements of the laser drilling system (not shown).

In step 330, workpiece 230 is unfastened and removed from workpiece holder 200 and placed in a location for safe storage until further processing or shipment to the final customer. In one example in a mass-manufacturing environment, vacuum source 212 is turned off, breaking the vacuum seal between workpiece 230 and workpiece holder 200, and then a robot arm removes workpiece 230 from workpiece holder 200. In another example, a system operator manually breaks the adhesive seal between workpiece 230 and workpiece holder 200, and then removes workpiece 230 from workpiece holder 200.

In step 340, it is determined whether a subsequent workpiece is to be drilled. If yes, method 300 returns to step 310; if no, method 300 ends.

A laser drilling system in accordance with the present invention may be used to construct a nozzle plate of an ink-jet head as further described below. Referring to FIG. 4, an ink-jet printer 1140 includes an ink-jet head 1141 capable of recording on a recording medium 1142 via a pressure generator. The ink-jet head 1141 is mounted on a carriage 1144 capable of reciprocating movement along a carriage shaft 1143.

In operation, ink droplets emitted from the ink-jet head 1141 are deposited on the recording medium 1142, such as a sheet of copy paper. The ink-jet head 1141 is structured such that it can reciprocate in a primary scanning direction X in parallel with the carriage shaft 1143; whereas the recording medium 1142 is timely conveyed by rollers 1145 in a secondary scanning direction Y.

Figure 5:
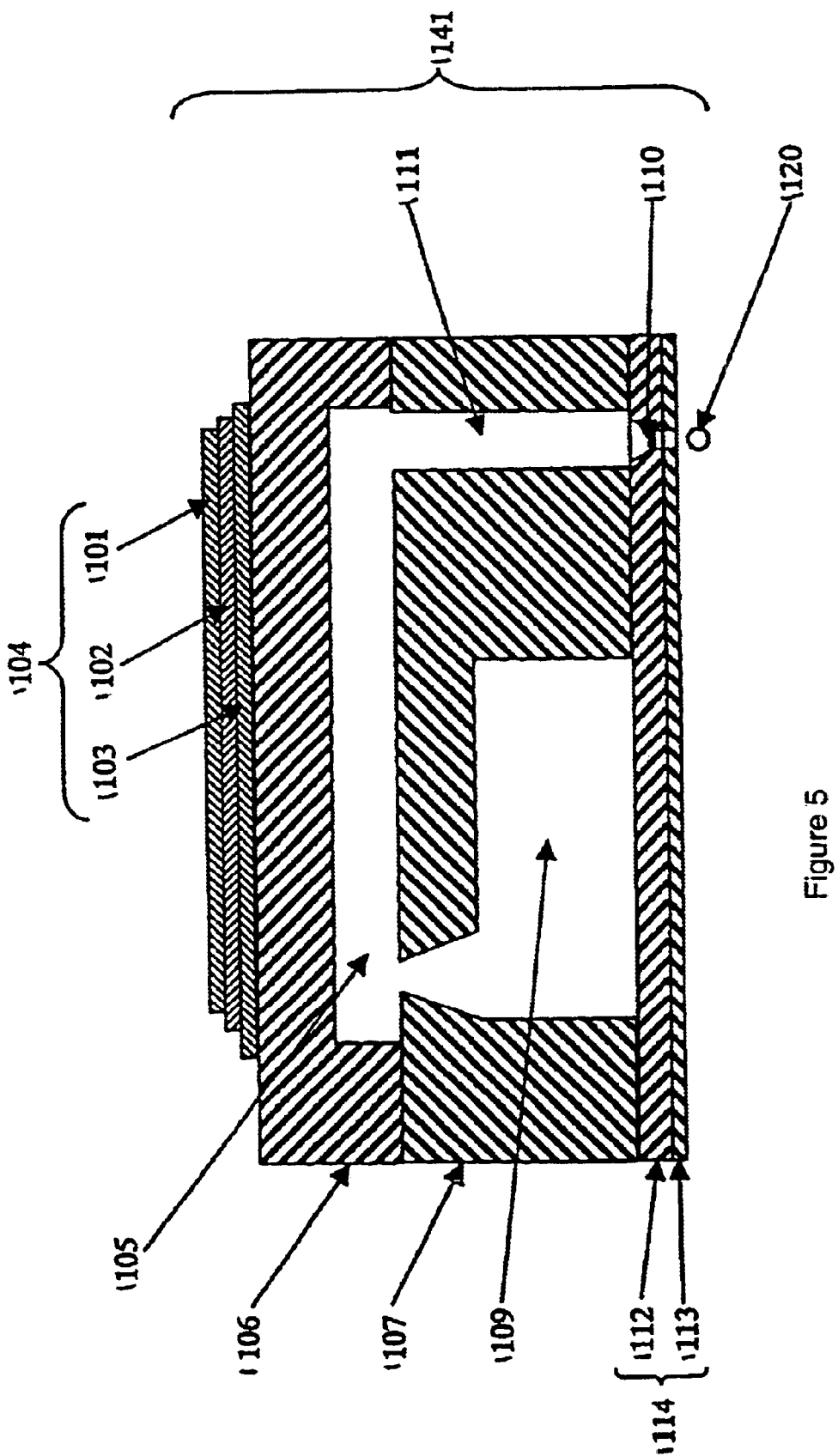
FIG. 5 is a cross-sectional schematic view of an exemplary ink-jet head.

FIG. 5 further illustrates the construction of an exemplary ink-jet head 1141. The ink-jet head is primarily comprised of a pressure generator 1104 and a nozzle plate 1114. In this embodiment, the pressure generator 1104 is a piezoelectric system having an upper electrode 1101, a piezoelectric element 1102, and a lower electrode 1103. Although a piezoelectric system is presently preferred, it is envisioned that other types of systems (e.g., a thermal-based system) may also be employed by the ink-jet head 1141.

The nozzle plate 1114 is further comprised of a nozzle substrate 1112 and a water repellent layer 1113. The nozzle substrate 1112 may be constructed from a metal or resin material; whereas the water repellant layer 1113 is made of fluororesin or silicone resin material. In this exemplary embodiment, the nozzle substrate 1112 is made of stainless steel having a thickness of 50 um and the water repellent layer 1113 is made of a fluororesin having a thickness of 0.1 um.

The ink-jet head 1141 further includes an ink supplying passage 1109, a pressure chamber 1105, and an ink passage 1111 disposed between the pressure generator 1104 and the nozzle plate 1114. In operation, ink droplets 1120 are ejected from the nozzle 110. The nozzle 1110 is preferably formed without flash and foreign matter (e.g., carbon, etc.) in the nozzle plate. In addition, the accuracy of the nozzle outlet diameter is 20 um±1.5 um.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A workpiece holder for use in a laser drilling system, comprising:
    a body having at least one planar support surface adapted to support a workpiece;
    a plurality of recesses formed in the planar support surface;
    a plurality of intermediate support surfaces defined between the plurality of recesses and providing additional support for the workpiece;
    at least one groove formed in the planar support surface, the groove being disposed outside of the plurality of recesses and within a periphery of the planar support surface; and
    a vacuum passage extending through the body of the holder.

2. The workpiece holder of claim 1 wherein a plurality of intermediate support surfaces are defined between the plurality of recesses, thereby providing additional support for the workpiece.

3. The workpiece holder of claim 1 wherein the plurality of recesses are configured to align/with a drilling pattern of the laser drilling system.

4. The workpiece holder of claim 1 wherein each of the plurality of recesses is a through hole that extends through the body of the holder.

5. The workpiece holder of claim 1 wherein each of the plurality of recesses is a blind hole that extends partially through the body of the holder.

6. The workpiece holder of claim 1 wherein the vacuum passage includes a first opening into the groove and a second opening along an exterior surface of the body.

7. A laser drilling system, comprising:
    a laser subsystem operable to project a laser beam onto an exposed surface of a substantially planar workpiece;
    workpiece holder being adapted to support the workpiece on a planar support surface thereof, the planar surface having a plurality of recesses formed therein and extending through the workpiece holder; and
    a means for securing the workpiece to the planar support surface of the workpiece holder, such that the workpiece extends across the plurality of recesses formed in the workpiece holder,
    wherein a plurality of intermediate support surfaces are defined between the plurality of recesses, thereby providing additional support for the workpiece.

8. The laser drilling system of claim 7 wherein the laser subsystem is operable to form a pattern of ablations in the exposed surface of the workpiece by projecting two or more laser beams onto the exposed surface of the workpiece and the plurality of recesses are configured to align with the pattern of ablations formed.

9. The laser drilling system of claim 7 wherein the workpiece holder further includes at least one groove formed in the planar support surface, the groove being disposed outside of the plurality of recesses and within a periphery of the planar support surface; and a vacuum passage extending through the body of the holder.

10. The laser drilling system of claim 9 wherein the vacuum passage includes a first opening into the groove and a second opening along an exterior surface of the body.

11. The laser drilling system of claim 9 wherein the means for securing the workpiece further comprises a vacuum operably connected to the vacuum passage of/the workpiece holder.

12. The laser drilling system of claim 7 wherein each of the plurality of recesses is a through hole that extends through the body of the holder.

13. The laser drilling system of claim 7 wherein each of the plurality of recesses is further defined as a blind hole that extends partially through the body of the holder.

14. The laser drilling system of claim 7 wherein the workpiece is comprised of a flimsy material.

15. The workpiece holder of claim 1 wherein the workpiece is further defined as a nozzle plate of an ink-jet head.

16. The laser drilling system of claim 7 wherein the workpiece is further defined as a nozzle plate of an ink-jet head.

* * * * *

UNITED STATES PATENT AND TRADEMARK OFFICE
CERTIFICATE OF CORRECTION

PATENT NO.    : 6,664,502 B1
DATED         : December 16, 2003
INVENTOR(S)   : Liu It is certified that error appears in the above-identified patent and that said Letters Patent is hereby corrected as shown below:

Column 7,
Line 34, "align/with" should be -- align with --

Column 8,
Line 31, "of/the" should be -- of the --

Signed and Sealed this

Seventh Day of September, 2004

JON W. DUDAS
*Director of the United States Patent and Trademark Office*